US006793512B2

(12) United States Patent
Abe et al.

(10) Patent No.: US 6,793,512 B2
(45) Date of Patent: Sep. 21, 2004

(54) SOCKET FOR SEMICONDUCTOR DEVICE

(75) Inventors: Shunji Abe, Yokohama (JP); Yuki Kudo, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/214,714

(22) Filed: Aug. 9, 2002

(65) Prior Publication Data

US 2003/0032320 A1 Feb. 13, 2003

(30) Foreign Application Priority Data

Aug. 10, 2001 (JP) .......................................... 2001-244890

(51) Int. Cl.[7] .............................................. H01R 11/22
(52) U.S. Cl. ........................................ 439/268; 439/264
(58) Field of Search ................................. 439/268, 258, 439/260, 263–266, 330, 337, 342

(56) References Cited

U.S. PATENT DOCUMENTS

| 5,342,214 | A | * | 8/1994 | Hsu | 439/342 |
| 6,126,467 | A | * | 10/2000 | Ohashi | 439/268 |
| 6,149,449 | A | * | 11/2000 | Abe | 439/268 |
| 6,261,114 | B1 | * | 7/2001 | Shimada | 439/266 |
| 6,328,587 | B1 | * | 12/2001 | Hsu | 439/342 |
| 6,402,537 | B2 | * | 6/2002 | Ikeya | 439/259 |
| 6,461,182 | B1 | * | 10/2002 | Hsu | 439/342 |
| 6,609,923 | B2 | * | 8/2003 | Sato et al. | 439/259 |

FOREIGN PATENT DOCUMENTS

| JP | 02-049381 | 2/1990 |
| JP | 10-302925 | 11/1998 |
| JP | 11-02126 | 1/1999 |

* cited by examiner

Primary Examiner—P. Austin Bradley
Assistant Examiner—X Chung-Trans
(74) Attorney, Agent, or Firm—Finnegan, Henderson, Farabow, Garrett & Dunner, LLP

(57) ABSTRACT

A rib is provided in a partition wall of a contact deviation member, so that when movable contact pieces in one contact terminal is apart from each other, the relative position of the movable contact piece in the one contact terminal is restricted to a movable contact piece in another contact terminal adjacent to the former pair.

8 Claims, 19 Drawing Sheets

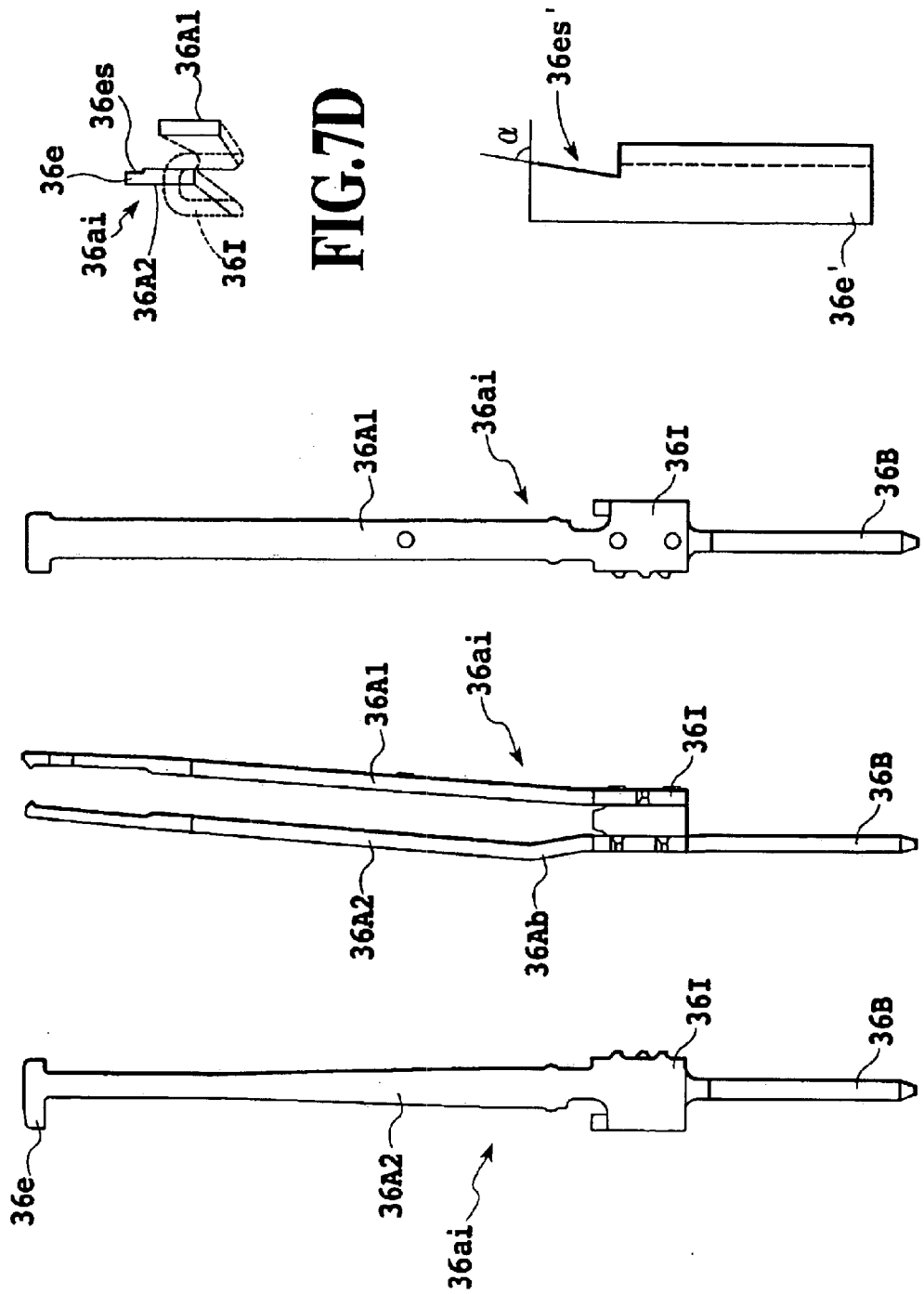

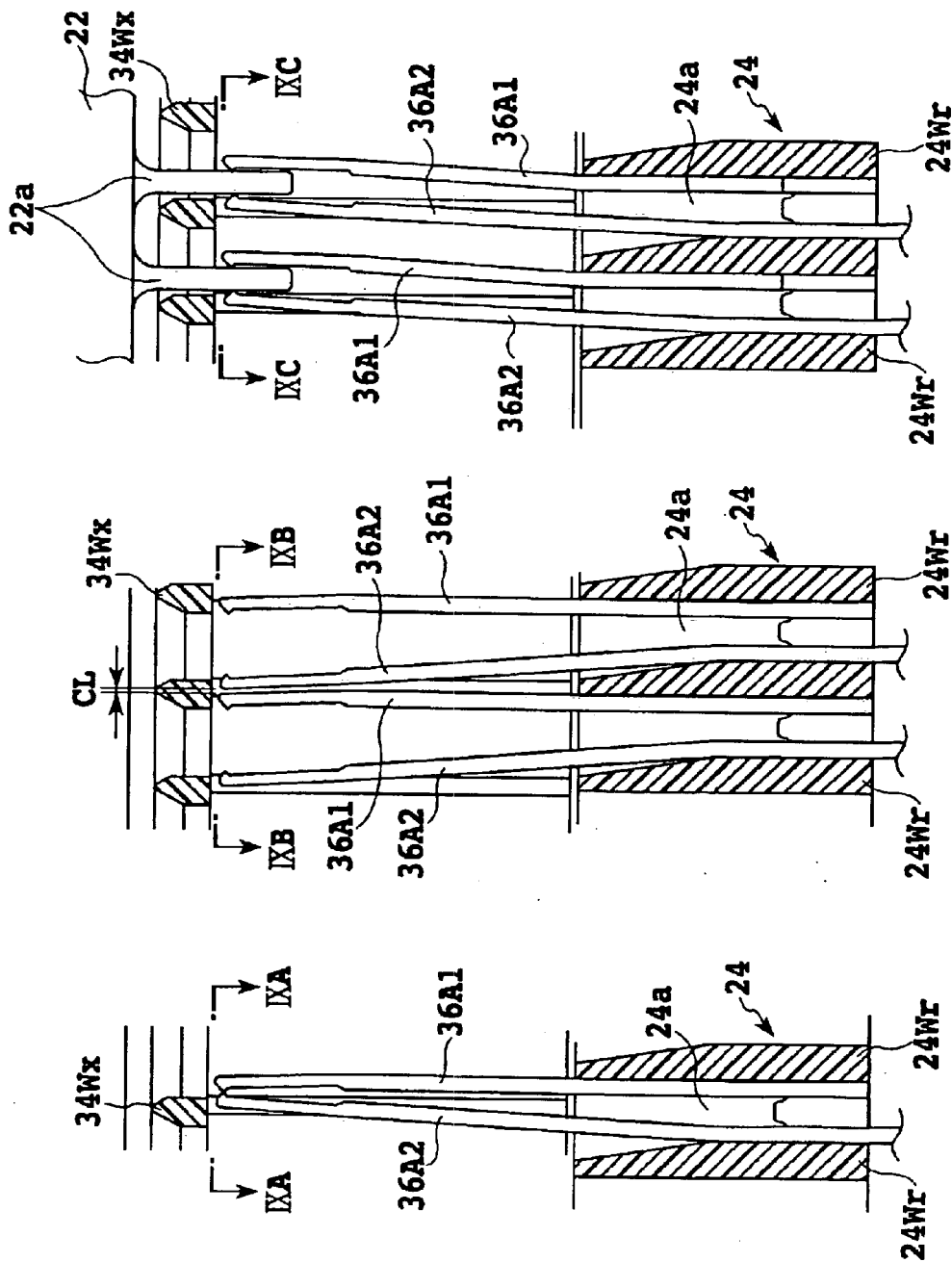

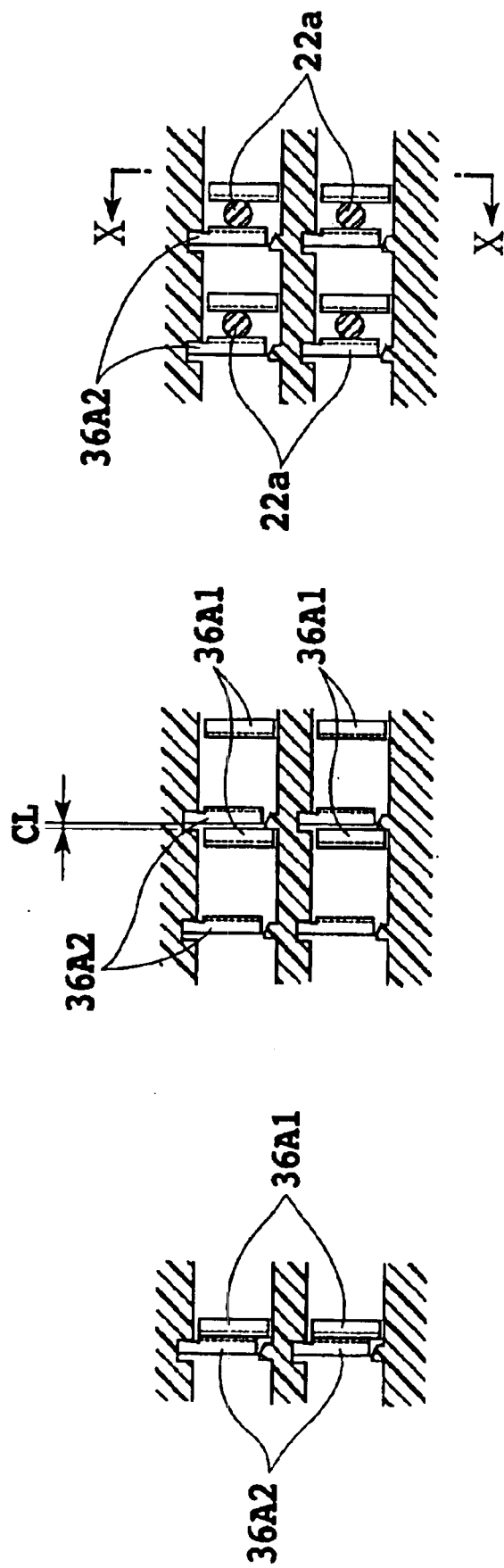

SOCKET FOR SEMICONDUCTOR DEVICE

This application is based on Patent Application No. 2001-244890 filed Aug. 10, 2001 in Japan, the content of which is incorporated hereinto by reference.

BACKGROUND OF THE INVENTION

1. Field of the Invention

The present invention relates to a socket for a semiconductor device used for testing the semiconductor device.

2. Description of the Related Art

Semiconductor devices to be mounted to an electronic equipment or others are subjected to various tests prior to being mounted so that potential defects thereof are removed. Such tests are carried out in a non-destructive manner by the application of voltage stress in correspondence to thermal and mechanical environmental tests, the high-temperature operation or the high-temperature reservation of the above-mentioned various tests. It has been said that a burn-in test is effective for removing integrated circuits having infant mortality failures, in which a performance test is carried out under a high-temperature condition for a predetermined period.

A socket for a semiconductor device used for such a test is disclosed, for example, in Japanese Patent Application laid-open No. 10-302925 (1998), wherein the socket is disposed on a printed circuit board having an input/output section for supplying a predetermined test voltage to the semiconductor device to be tested and issuing an abnormality detection signal generated therefrom, representing a short-circuit accident or others.

The semiconductor device-socket includes, for example, a positioning member having an accommodation portion in which a semiconductor element as the semiconductor device is mounted, a contact deviation member 2 disposed to be reciprocated in the predetermined direction as shown in FIG. 15, while supporting the positioning member and causing one movable contact piece of a contact terminal described later to be closer to and farther from the other movable contact piece, a socket body 6 disposed on a printed circuit board to accommodate the contact deviation member 2 in a movable manner (see FIG. 17A), and a cover member (not shown) for converting an operating force applied thereto and transmitting the same to the contact deviation member 2 via a drive mechanism not shown.

As shown, for example, in FIGS. 17A, 17B and 17C, a group of terminals of the printed circuit board are connected to proximal ends 4B of terminals in a plurality of contact terminals 4ai (wherein i=1 to n; n represents a positive integer) provided in the socket body 6.

The respective contact terminal 4ai is provided in correspondence to each of electrode sections 8a on a semiconductor element 8 mounted to the positioning member, and consists of the proximal terminal 4B and a pair of movable contact pieces 4F and 4M coupled to the terminal 4B to selectively nip the respective electrode section 8a of the semiconductor element 8 for the electrical connection therewith as shown in FIG. 17C.

The pair of movable contact pieces 4F and 4M of the thin plank-type contact terminal 4ai is inserted into the respective contact accommodation portion 2a as shown in FIGS. 15 and 16. The respective contact accommodation portion 2a is formed by partitioning the interior of the contact deviation member 2 with partitioning walls 2Wa extending in the moving direction of the contact deviation member 2 shown by an arrow C. Note that FIGS. 15 and 16 illustrate a released state in which the pair of movable contact pieces 4F and 4M of the contact terminal 4ai are apart from each other.

A plurality of partition walls 2Wt extending transverse to the partition walls 2Wa are disposed at a predetermined distance from each other above the contact accommodation portions 2a. Thereby, a plurality of relatively small generally square openings are defined at an upper end of the contact deviation member 2. Directly underneath the respective partition wall 2Wt, a groove engageable with part of the side portion of the movable contact piece 4M is formed.

The respective contact terminals 4ai, each having the opposite pair of movable contact pieces 4F and 4M, are arranged in a line so that the movable contact pieces 4F in the one contact terminal 4ai is adjacent to the movable contact piece 4M of the other contact terminal 4ai.

When the contact deviation member 2 moves from one state shown in FIGS. 17A and 18A to another state in direction as shown by an arrow in FIGS. 17B and 18B, the pair of movable contact pieces 4F and 4M move from a position shown by a chain double-dashed line to another position shown by a solid line due to the movement of the movable section 4M accompanied with the movement of the respective groove, whereby both the movable contact pieces 4F and 4M are further away from each other. In this state, the semiconductor element 8 is mounted. Or the semiconductor element 8 having being tested is removed from the socket body 6.

In this connection, the mounting of the semiconductor element 8 may be carried out by an automated machine or by a hand of the operator, during which the respective electrode sections 8a of the semiconductor element 8 are guided by all the peripheral edges of openings formed at the upper end of the contact deviation member 2 and accommodated into the contact accommodation portions.

On the other hand, when the contact deviation member 2 moves in the direction as shown in FIG. 18C by an arrow, the pair of movable contact pieces 4M and 4F moves from a state shown by a chain double-dashed line in which both the movable contact pieces are away from each other to another state shown by a solid line in which both the movable contact pieces are closer to each other to nip the electrode section 8a of the semiconductor element 8.

There is a risk in that, between adjacent two contact terminals 4ai, a movable contact piece 4M in the one contact terminal 4ai is brought into contact with another movable contact piece 4F in the other contact terminal 4ai because an opening amount between the pair of movable contact pieces 4M and 4F individually varies between distal ends thereof due to the manufacturing error as shown in FIGS. 17B and 18B by a solid line. In that case, If a test signal is issued from the printed circuit board to the pair of movable contact pieces 4F and 4M under such a condition, there may be a short-circuit accident. A contact accident of this kind would become significant as the density of the electrode section 8a of the semiconductor element 8 increases while ensuring a necessary opening amount between the pair of movable contact pieces 4M and 4F.

To avoid such an accident, it would be thought that the opening amount between the pair of movable contact pieces 4F and 4M is selected to be smaller than the predetermined opening amount by taking the variance thereof into account.

The above countermeasure, however, is defective because the opening amount between the distal ends of the pair of movable contact pieces 4F and 4M is insufficient to become a factor to cause an undesirable faulty attachment of the electrode section 8a of the semiconductor element 8. Thus, it is inadvisable to do so.

When the semiconductor element is mounted to the accommodation portion in the positioning member, there may be a case wherein the terminal of the semiconductor element does not fit in the contact accommodation portion 2a but rides on the outside of the entire outer periphery of the contact accommodation portion 2a due to the manufacturing error. Thereby, the above-mentioned burn-in test may not be quickly carried out.

SUMMARY OF THE INVENTION

In view of the above problems, an object of the present invention is to provide a socket used for testing a semiconductor device, capable of avoiding the mutual contact of movable contact pieces in adjacent contact terminals with each other as well as ensuring the maximum opening amount between both the movable contact pieces in the contact terminal.

To achieve the above object, a socket for a semiconductor device, comprising a plurality of contact terminals disposed in a socket body for accommodating the semiconductor device having a plurality of contact terminals, each contact terminal having a pair of movable contact pieces for selectively nipping each of the terminals in the semiconductor device to carry out electrical connection, a contact deviation member provided in the socket body in a movable manner, for causing the contact terminal to carry out the electrical connection/disconnection by selectively moving one of the pair of movable contact pieces to be closer to or farther from the other, and a position-restricting means formed in the contact deviation member, for restricting a position of one of the pair of movable contact pieces relative to another movable contact piece in the adjacent contact terminal when the former movable contact piece is farther from the other movable contact piece in the same pair and closer to the latter movable contact piece in the adjacent contact terminal, so that the relative position of the former movable contact piece is restricted to the latter movable contact piece.

A plurality of the position-restricting means may be disposed opposite to portions of a partition wall for individually dividing rows of the contact terminals in the contact deviation member, in which portion holds one of the movable contact pieces.

The portion of the partition wall for holding the one of the movable contact pieces may be provided with an engaging groove for the engagement with the movable contact pieces.

The position-restriction means may be a projection adapted such that when one movable contact piece is farther from the other movable contact piece in the same contact terminal and closer to another movable contact piece in the adjacent contact terminal, the projection abuts to the back surface of the latter movable contact piece and forms a gap between both the contact pieces being closer to each other.

A slope may be continuously formed along a boundary between the entire outer periphery of a contact accommodation portion for accommodating the pairs of movable contact pieces of the plurality of contact terminals and the placement region for placing the semiconductor device, for introducing the terminals of the semiconductor device just before being placed into the contact accommodation portion.

As apparent from the above description, according to the socket for a semiconductor device, since the position-restricting means is formed in the contact deviation member to restrict, when one movable contact piece in one contact terminal is away from the other movable contact piece in the same contact terminal, the relative position of the one movable contact piece to another movable contact piece in the adjacent contact terminal, it is possible to avoid the mutual contact between the movable contact pieces adjacent to each other, as well as ensuring the maximum opening amount between both the movable contact pieces in the contact terminal.

Since the slope is continuously formed along the boundary between the entire outer periphery of the contact accommodation portion and the placement region for placing the semiconductor device, it is possible to assuredly mount the semiconductor device.

The above and other objects, effects, features and advantages of the present invention will become more apparent from the following description of embodiments thereof taken in conjunction with the accompanying drawings.

BRIEF DESCRIPTION OF THE DRAWINGS

FIGS. 7A, 7B, 7C and 7D are a left side view, a front view, a right side view and a plan view, respectively, of a contact terminal shown in an enlarged scale, which are used in the embodiment shown FIG. 2, and FIG. 7E is a plan view of an example of a distal end shape of a modified movable contact piece of a contact terminal shown in an enlarged manner;

FIGS. 8A, 8B and 8C are partially sectional views, respectively, made available for illustrating the operation of the embodiment shown in FIG. 2;

FIGS. 9A, 9B and 9C are sectional views taken along a line IXA—IXA in FIG. 8A, along a line IXB—IXB in FIG. 8B, and along a line IXC—IXC in FIG. 8C, respectively;

DETAILED DESCRIPTION OF PREFERRED EMBODIMENTS

Figure 2:
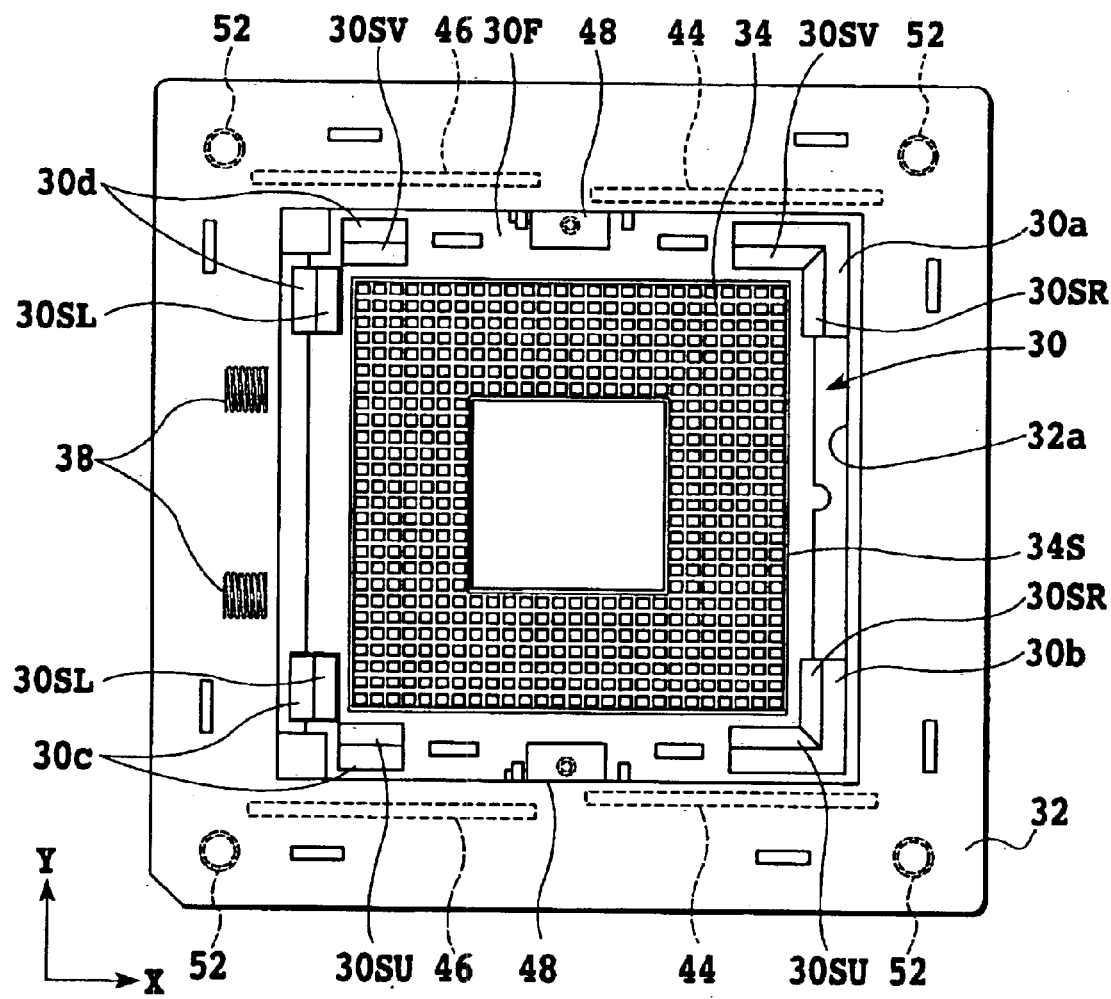
FIG. 2 is a plan view of a socket for a semiconductor device according to one embodiment of the present invention, illustrating an overall appearance thereof.
Figure 3:
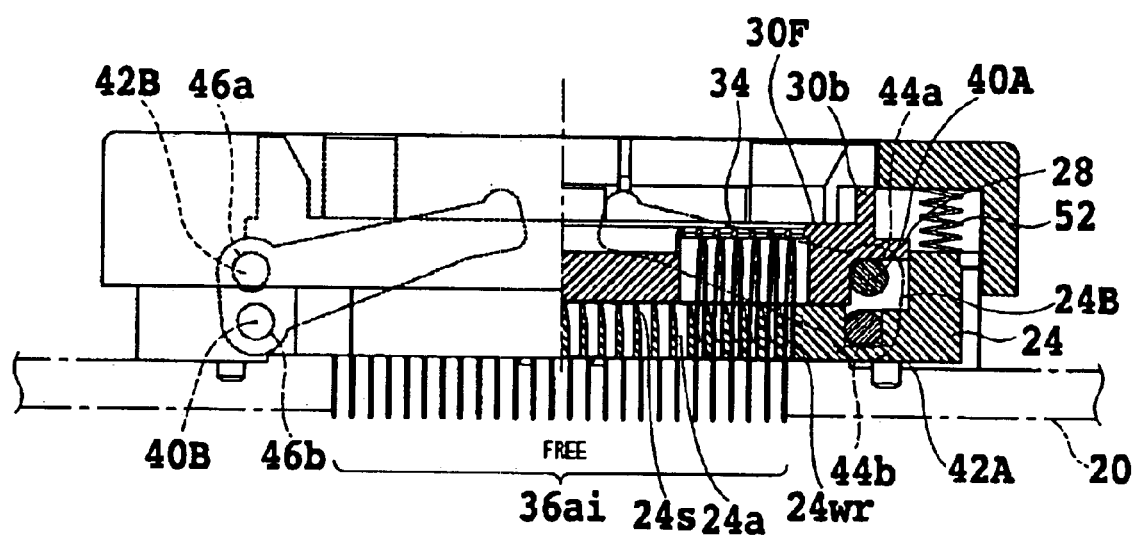
FIG. 3 is a front view of the embodiment shown in FIG. 2 including a partially sectional view thereof.

FIGS. 2 and 3 illustrate one embodiment of a socket for a semiconductor device according to the present invention.

A socket for a semiconductor device arranged on a printed circuit board 20 includes a contact deviation member 28 having a positioning section 30 which is an area for accommodating therein a semiconductor device such as a PGA type semiconductor element, capable of reciprocating in a predetermined direction so that one movable contact piece of a contact terminal 36ai described later is closer to or farther from the other movable contact piece thereof, a socket body 24 for accommodating the contact deviation member 28 to be movable relative thereto, and a cover member 32 for converting via a drive mechanism described later the operating force applied thereon and transmitting the same to the contact deviation member 28.

Figure 6A:
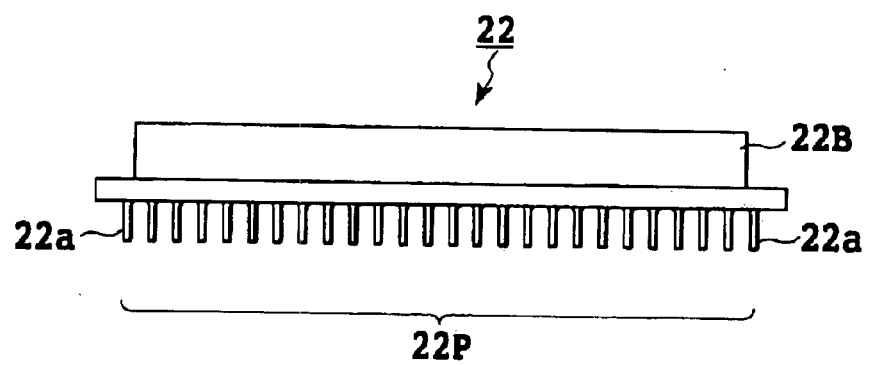
FIG. 6A is a front view of a semiconductor device mounted onto the embodiment of FIG. 2.
Figure 6B:
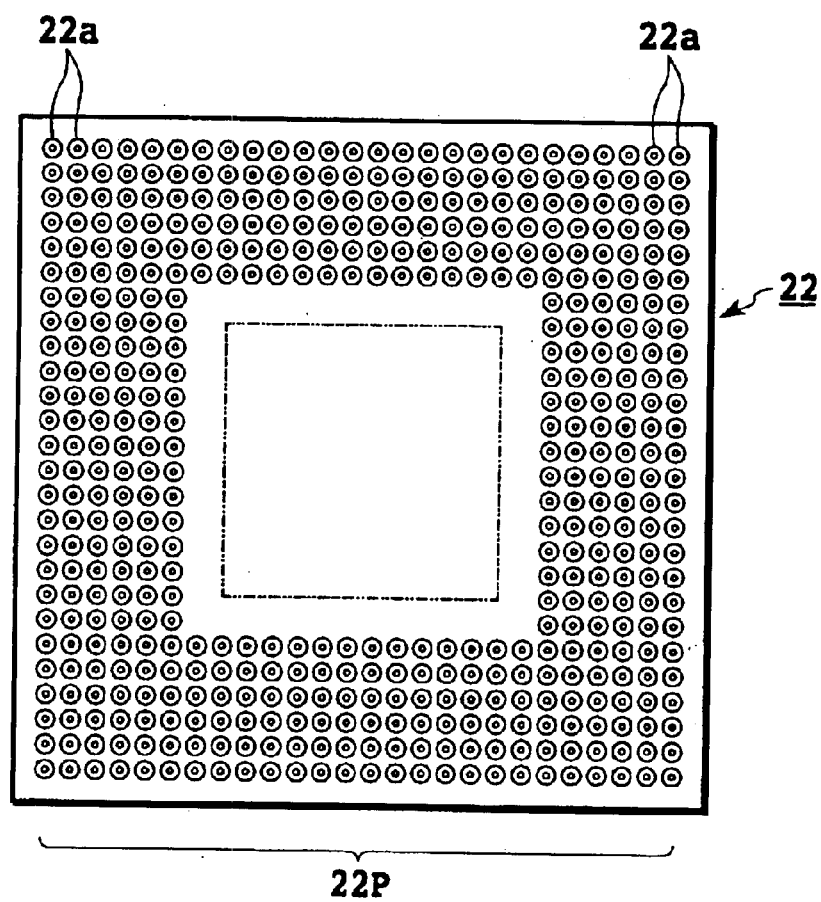
FIG. 6B is a plan view illustrating a group of electrodes formed on the lower surface of the semiconductor device shown in FIG. 6A.

As shown in FIGS. 6A and 6B, the semiconductor element 22 mounted as an object to be tested to such a socket includes a substrate section 22B in the interior of which is formed a highly integrated circuit as electronic circuits and an electrode group 22P consisting of a plurality of pin-type electrodes 22a electrically connected to the highly integrated circuit in the substrate section 22B and projected from the lower surface of the substrate section 22B. Each of the pin-type electrodes 22a in the electrode group 22P is arranged at a predetermined distance relative to the other in the vertically and horizontally directions while encircling a generally square central portion.

At predetermined positions in the printed circuit board 20, at each of which an input/output section is provided for supplying a predetermined test voltage and delivering an abnormality signal representing a short-circuit accident or others generated from the semiconductor device 22 as the object to be tested, a plurality of groups of electrodes electrically connected via a conductive layer to the input/output section are provided in accordance with the respective socket body 24. To the respective group of the electrodes, proximal ends of a plurality of contact terminals 36ai provided in the respective socket body 24 described later are electrically connected.

Each of socket bodies 24 arranged in correspondence to the respective electrode group on the printed circuit board 20 is located at a predetermined position on the printed circuit board 20 by the engagement of a positioning pin thereof into a hole in the circuit board 20.

As shown in FIG. 3, the respective socket body 24 has accommodation portions 24a in the bottom portion thereof into each of which a coupling between the movable contact pieces 36A1 and 36A2 of the respective contact terminal 36ai is press-fit. The respective accommodation portion 24a is formed through the bottom portion in correspondence to the electrode 22a in the semiconductor element 22 to be mounted.

Figure 4:
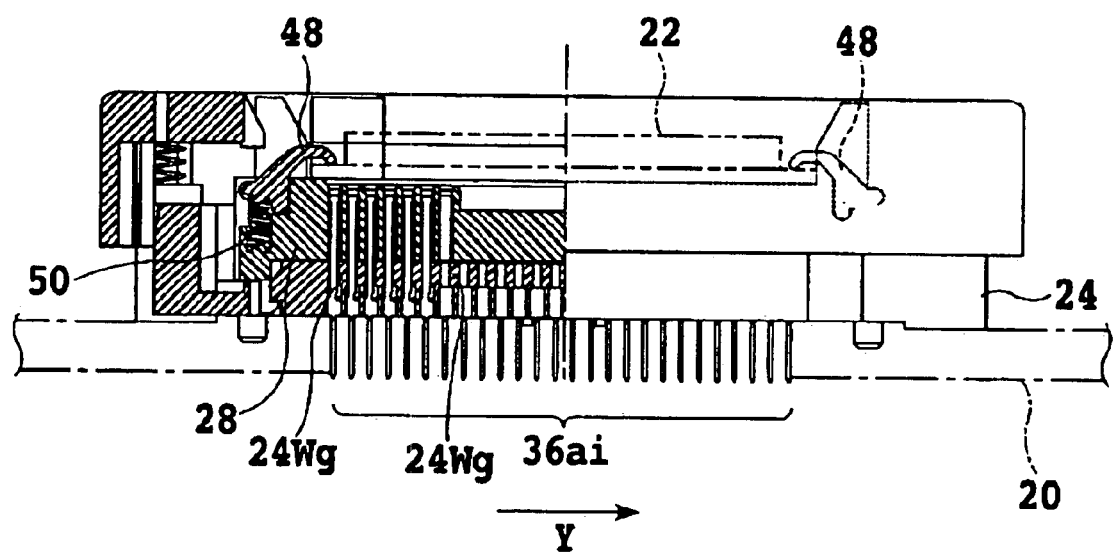
FIG. 4 is a side view of the embodiment shown in FIG. 2 including a partially sectional view thereof.

As shown in FIG. 3, the every adjacent accommodation portions 24a are sectioned by a partition wall 24wr located at a predetermined distance in the direction shown by an arrow X. As shown in FIG. 4, the every adjacent accommodation portions 24a in the respective row are sectioned by a partition wall 24wg formed at a predetermined distance in the direction shown by an arrow Y.

The partition wall 24wr has a slope 24s inclined right-downward on one surface for guiding the one movable contact piece 36A2 of the contact terminal 36ai when the latter moves, as shown in FIG. 3.

The plurality of contact terminals 36ai (i=1 to n wherein n represents an positive integer) in the socket body 24 are provided in correspondence to the respective electrodes 22a of the semiconductor element 22 to be mounted. As shown in FIGS. 7A, 7B and 7C, the contact terminal 36ai has a proximal terminal 36B, a coupler 36I of a U-shaped cross-section to be coupled to one end of the proximal terminal 36B, and a pair of movable contact pieces 36A1 and 36A2 of a thin sheet type connected to the respective sides of the coupler 36I and selectively nipping the respective electrode 22a of the semiconductor element 22.

The other end of the terminal 36B is coupled to a generally central portion of one side of the coupler 36I. The pair of movable contact pieces 36A1 and 36A2 are coupled to the coupler 36I to be obliquely opposite to each other at a predetermined distance therebetween as shown in FIG. 7D. The movable contact piece 36A2 has an engaging leaf 36e at a tip end thereof to be engageable with an engaging groove of the contact deviation member 28 described later. The engaging leaf 36e extends in the widthwise direction of the movable contact piece 36A2, and has a stepped portion 36es with a thickness smaller than the other portion. Also, as shown in FIG. 7B, in the vicinity of the coupler 36I, the movable contact piece 36A2 has a portion 36Ab bending in the direction that apart from the movable contact piece 36A1.

In this regard, while the stepped portion 36es in the movable contact piece 36A2 is often generally parallel to an end surface orthogonal to the widthwise direction, the present invention should not be limited thereto but an engaging leaf 36e' may be a tenon having a stepped portion 36es' oriented a predetermined α degrees below 90° away from the end surface orthogonal to the widthwise direction as shown in FIG. 7E.

Thus, the pair of movable contact pieces 36A1 and 36A2 of the contact terminal 36ai are closer to each other in accordance with the movement of the contact deviation member 28 due to the elasticity to nip the respective electrode 22a of the semiconductor element 22, or the pair of movable contact pieces 36A1 and 36A2 of the contact terminal 36ai keep a distance each other to release the electrode 22a of the semiconductor element 22 when the engaging leaf 36e of the movable contact piece 36A2 thereof moves by the movement of the contact deviation member 28.

As shown in FIG. 3, a recess 24B is formed above the accommodation portions 24a of the socket body 24, in which the contact deviation member 28 is disposed in a slidable manner.

The contact deviation member 28 is movable within the recess 24B of the socket body 24 along the moving direction of the movable contact pieces 36A1 and 36A2 of the respective contact terminal 36ai. The contact deviation member 28 includes a positioning section 30 by which the semiconductor element 22 is positioned, and a contact piece accommodating section 34 formed beneath the positioning section 30 to be integral therewith, for accommodating the pair of movable contact pieces 36A1 and 36A2 of the contact terminal 36ai.

The positioning section 30 includes positioning members 30a, 30b, 30c and 30d for positioning and holding four corners of the substrate section 22B of the semiconductor element 22 to be mounted. Thereby, the positioning members 30a to 30d operate to position the respective electrodes 22a relative to gaps between the pairs of movable contact pieces 36A1 and 36A2 in the respective contact terminals 36ai. The positioning members 30a and 30b have inside slopes 30SR and 30SV and slopes 30SR and 30SU on the upper surface, respectively, each of which pairs of slopes are orthogonal to each other. On the other hand, the positioning members 30d and 30c have inside slopes 30SL and 30SV and slopes 30SL and 30SU on the upper surface, respectively, each of which pairs of slopes are orthogonal to each other.

Latch members 48 are provided between the positioning members 30a and 30d and between the positioning members 30b and 30c, respectively, for selectively pressing the mounted semiconductor element 22 onto a placement region 30F in the positioning section 30. As shown in FIG. 4, a base end of the latch member 48 is held to move rotationaly to the positioning section 30. In the vicinity of the lower end of the proximal end of the latch member 48, a coil spring 50 is provided to bias a front end of the latch member 48 toward the substrate section 22B of the mounted semiconductor element 22. Further, a middle portion of the latch member 48 engages with the inner surface of the cover member 32 described hereinafter. Accordingly, the latch member 48 is selectively moved rotationaly in accordance with the upward and downward movement of the cover member 32.

The contact piece accommodating section 34 of the contact deviation member 28 is defined in a central area while being encircled with the positioning members 30a to 30d in the positioning section 30 and the placement region 30F.

Figure 1:
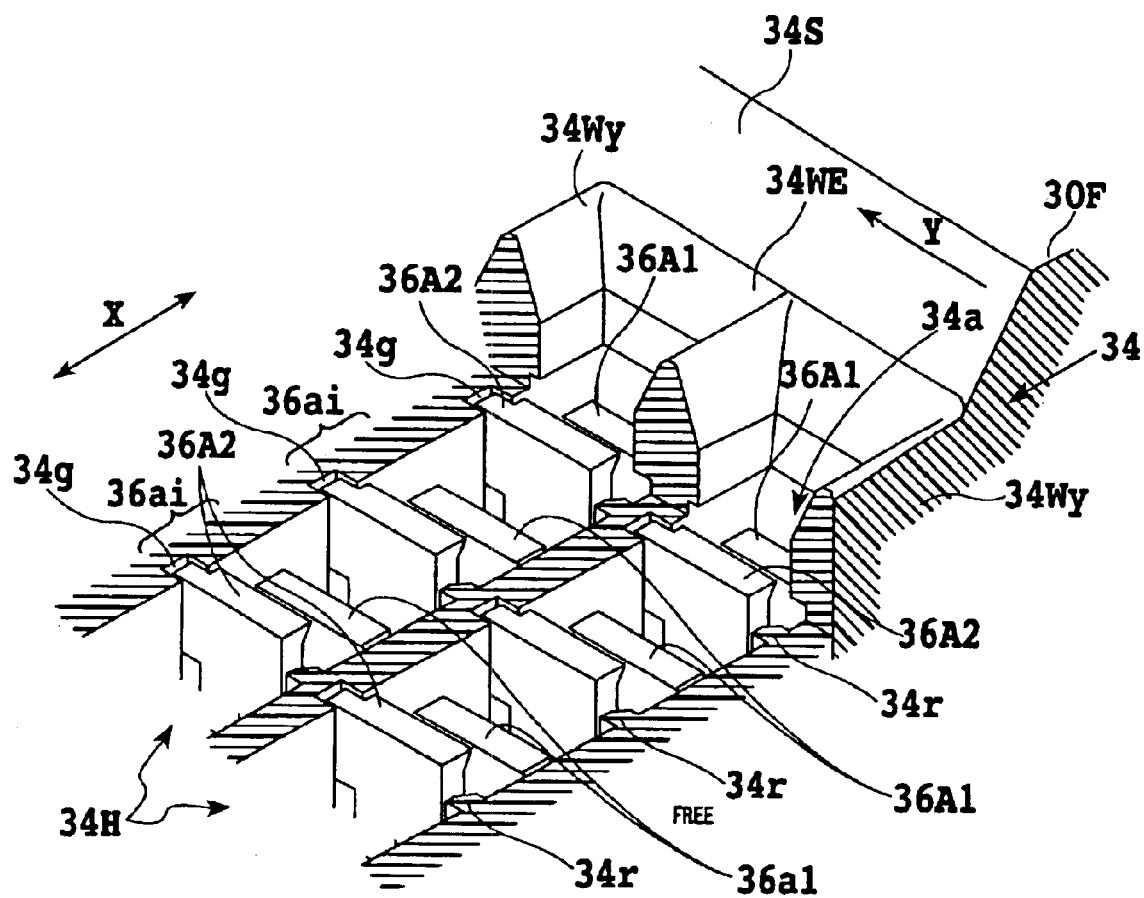
FIG. 1 is a perspective view partially showing a main portion of a socket for a semiconductor device according to one embodiment of the present invention.
Figure 10:
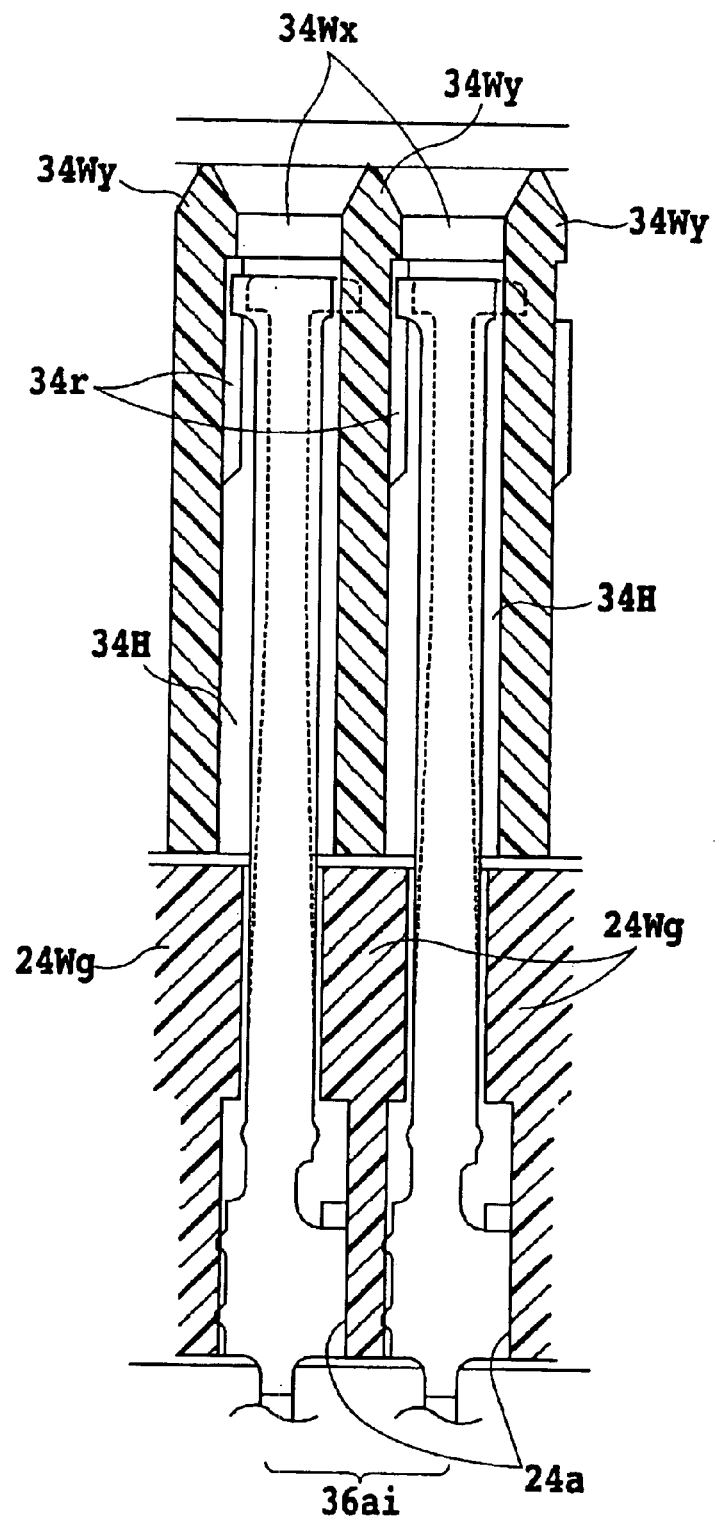
FIG. 10 is a partially sectional view taken along a line X—X in FIG. 9C.
Figure 12A:
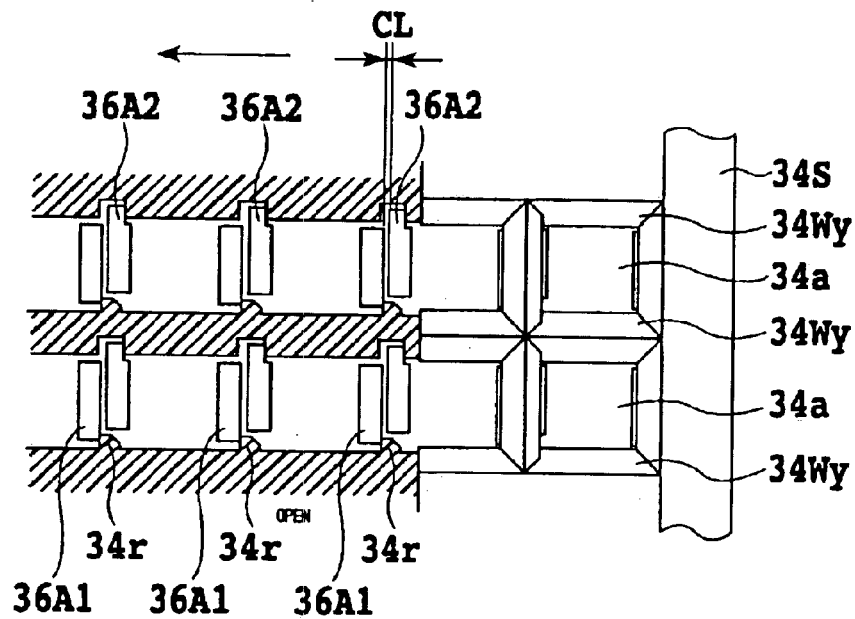
FIGS. 12A and 12B are plan views, respectively, partially illustrating states showing in FIGS. 9A and 9B.
Figure 12B:
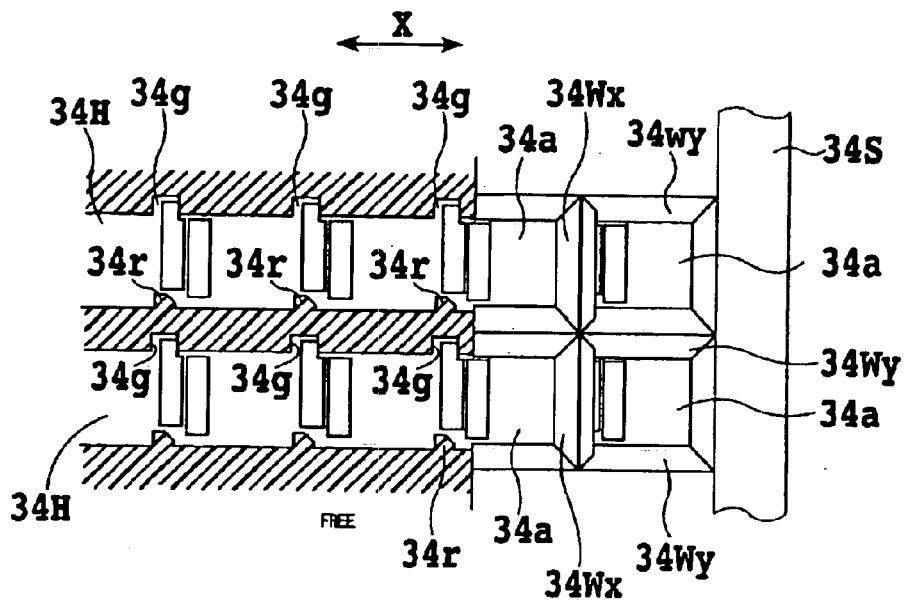

As shown in an enlarged manner in FIGS. 1 and 12B, openings 34a are formed in all directions at a predetermined distance in correspondence to the arrangement of the electrodes 22a of the semiconductor element 22 above the movable contact pieces 36A1 of the respective contact terminals 36ai in the contact piece accommodating section 34. For example, the openings 34a of approximately 0.82 mm square are defined as a skeleton framework formed of lattice walls. As shown in FIG. 10, the respective opening 34a communicates with an elongate space 34H accommodating the movable contact piece 36A1 of the contact terminal 36ai or others. The lattice walls consist of partition walls 34wy formed parallel to the direction indicated by arrow Y in FIG. 1 and partition walls 34wx formed parallel to the direction indicated by arrow X shown in FIG. 1, which are crossed to each other.

As shown in FIG. 10, the partition walls 34wy extend downward so that the spaces 34H in which the movable contact pieces 36A1 of the contact terminals 36ai in the adjacent rows are accommodated are partitioned. On the other hand, a lower end of the partition wall 34wx does not enter the space 34H.

In the vicinity of a portion at which the partition wall 34wx intersects the partition wall 34wy, engaging grooves 34g are formed at a predetermined distance on one of the surfaces thereof to be engageable with the engaging leafs 36e.

Figure 11A:
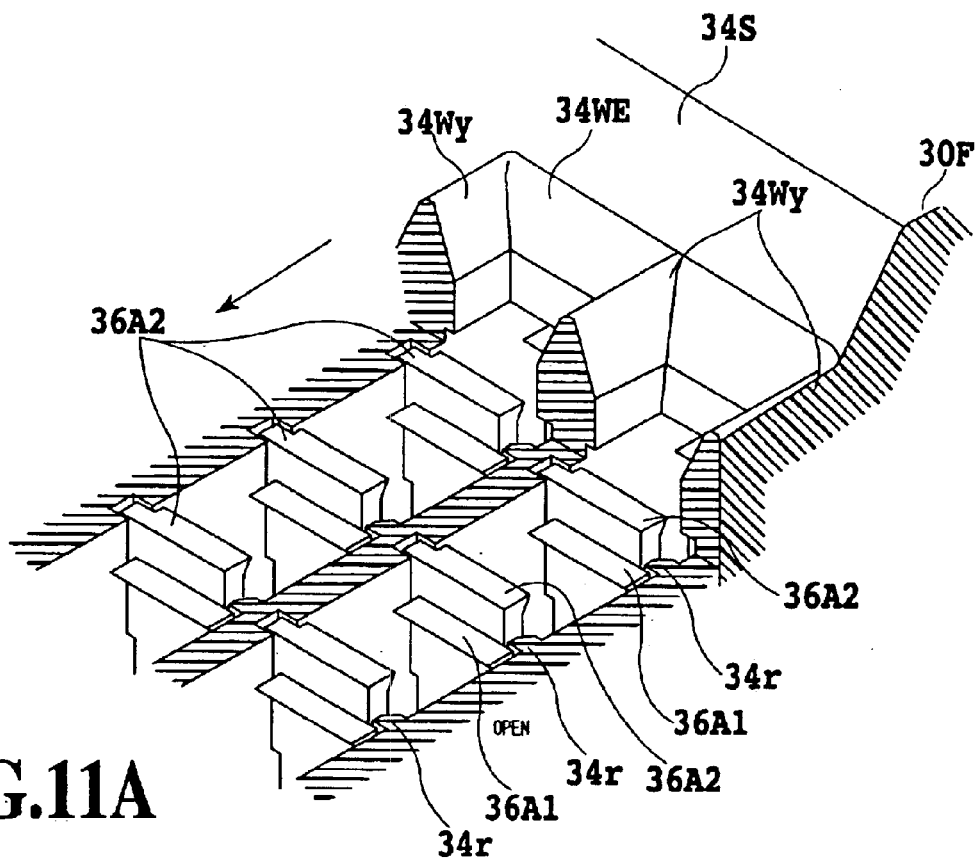
FIGS. 11A and 11B are perspective views, respectively, illustrating a state shown in FIG. 9B.
Figure 11B:
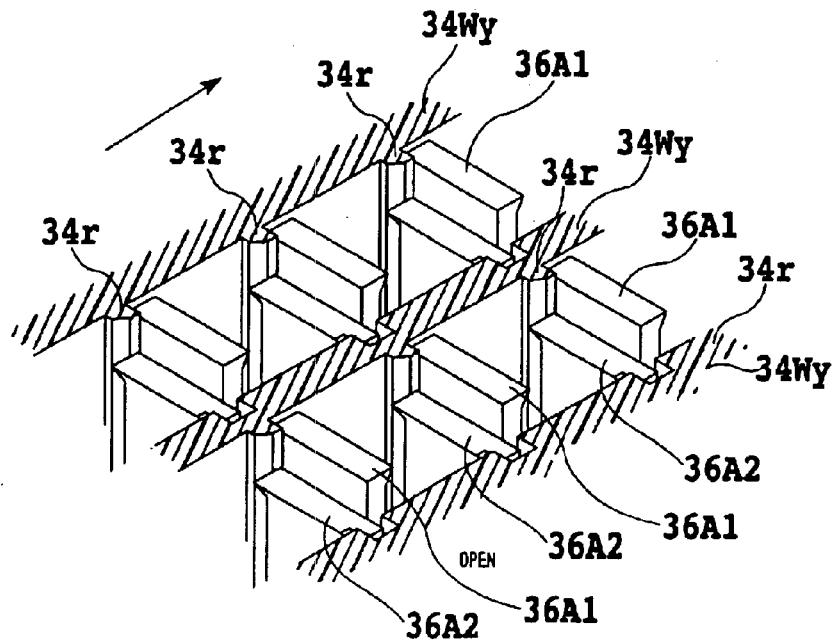

As shown in FIGS. 1, 10 and 11B, on the other surface of the partition wall 34wy, a rib 34r of a predetermined length operative as a position-restricting means extends downward at a position corresponding to the engaging groove 34g. A height of the rib 34r is selected so that the movable contact piece 36A2 passing thereby does not interfere with the rib 34r but the side of the movable contact piece 36A1 engages therewith as described later.

The present invention should not be limited to the above embodiment. For example, in the vicinity of the intersection between the partition walls 34wy and 34wx, both of a rib 34r operative as the position-restricting means and an engaging groove 34g to be engaged with the engaging leaf 36e of the movable contact piece 36A2 of the contact terminal 36ai may be provided adjacent to each other on surfaces of both the partition walls.

While the respective partition walls 34wy are arranged so that front ends of the ribs 34r are directed in the direction indicated by arrow Y in the embodiment shown in FIG. 1, the respective partition walls 34wy may be arranged so that front ends of the ribs 34r are directed in the direction opposite to the direction indicated by arrow Y.

Further, by providing a plurality of ribs 34r at a predetermined distance, operative as the position-restricting means on opposite surfaces of a central partition wall formed at a center of the contact piece accommodating section 34, in two areas of the contact piece accommodating section 34 sectioned by the central partition wall, the partition walls 34wy in the respective areas may be arranged so that front ends of the ribs 34r are directed opposite to each other.

The plurality of contact terminals 36ai arranged in the respective space 34H are disposed in a row so that a back surface of the movable contact piece 36A2 of the one contact terminal 36ai is opposed to a back surface of the movable contact piece 36A1 of the other contact terminal 36ai between adjacent two contact terminals 36ai.

As shown in FIG. 1 in an enlarged manner, at a boundary between an inner wall 34WE of a square defined by connecting both ends of the respective partition wall 34wy and the respective partition wall 34wx with each other and the placement region 30F described above, a slope 34S is formed all around the boundary as a guide surface for introducing a front end of the respective electrode 22a into the opening 34a when the semiconductor element 22a described above drops from a predetermined height. Accordingly, the slope 34S is formed by connecting the end of the placement region 30F to the upper end of the inner wall 34WE. A length and a surface area of the slope 34S having the predetermined gradient are selected to be relatively smaller than a length and a surface area of the slope 30SR and 30SV, and those of the slope 30SR and 30SU.

A rotary shaft 40A and a supporting shaft 42B extending in the direction indicated by arrow Y shown in FIG. 2 are engaged to opposite ends of an outer periphery of the contact deviation member 28. The opposite ends of the rotary axis 40A are fit into through-holes 44a in a proximal end of the lever member 44 extending in the direction indicated by arrow x around the outer periphery of the contact deviation member 28, respectively. The opposite ends of the supporting shaft 42B are fit into through-holes 46a in a proximal end of the lever member 46, respectively. The supporting shaft 42B is secured to the socket body 24.

At that time, the respective end of the supporting shaft 42A is fit in a through-hole 44b provided beneath the through-hole 44a of the respective lever member 44. The supporting shaft 42A is secured to the socket body 24. Also, opposite ends of a rotary shaft 40B are fit into through-holes 46b provided beneath the through-holes 46a in the respective lever members 46.

Front ends of the respective lever members 44 and 46 are in contact with the lower end surface of the cover member 32 described later or opposed thereto at a predetermined gap therefrom.

Thus, since the lever members 44 and 46 and the rotary shafts 40A and 40B move rotationaly in accordance with the upward/downward movement of the cover member 32, the contact deviation member 28 is made to reciprocate, for example, in the direction indicated by arrow X shown in FIG. 2.

Further, as shown in FIG. 2, between one end of the contact deviation member 28 and an inner periphery of the recess 24B, there is a coil spring 38 as a urging member for biasing the contact deviation member 28 to the initial position.

The cover member 32 encircling the outer periphery of the positioning section 30 has an opening 32a through which the semiconductor element 22 or the positioning section 30 passes. As shown in FIGS. 2 and 3, there are four coil springs 52 between the inner surface of the cover member 32 and the upper end of the socket body 24, for biasing the cover member 32 upward.

Accordingly, when the contact deviation member 28 is moved against the biasing force of the coil spring 38 in accordance with the downward movement of the cover member 32 against the biasing force of the coil springs 52, the movable contact piece 36A2 of the respective contact terminal 36ai engaged with the engaging groove 34g is move apart from the movable contact piece 36A1.

On the other hand, the contact deviation member 28 is moved to the initial position due to the biasing force of the coil spring 38 and the recovery force of the movable contact piece 36A2 in accordance with the upward movement of the cover member 32 caused by the biasing force of the coil springs 52.

Figure 5:
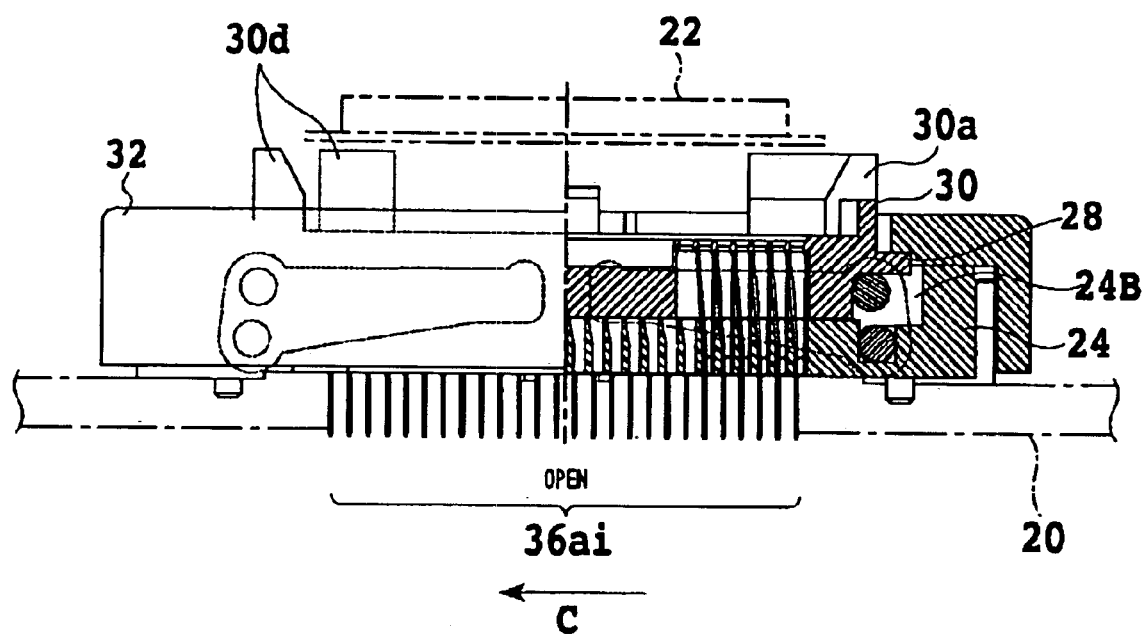
FIG. 5 is a front view made available for illustrating the operation of the embodiment of FIG. 2.

In such a structure, when the semiconductor element 22 is accommodated within the accommodation portion of the positioning section 30 as shown by a two-dot chain double-dashed line as shown in FIG. 5, the cover member 32 is first moved downward. Thereby, the contact deviation member 28 is moved by a predetermined distance against the biasing force of the spring 38 in the direction indicated by arrow C.

At that time, the movable contact piece 36A2 of the respective contact terminal 36ai is moved together with the contact deviation member 28 in direction indicated by an arrow in FIGS. 11A and 12A, from a state shown in FIGS. 8A and 9A to a state shown in FIGS. 8B and 9B. Thereby, as shown in FIG. 11B, the respective rib 34r touches to a lateral end of a back surface of the movable contact piece 36A1 of the other contact terminal 36ai adjacent thereto.

Accordingly, since a relative position of the respective rib 34r to a back surface of the movable contact piece 36A2 is predetermined, a clearance CL, for example, of approximately 0.12 mm is assuredly maintained between the back surface of this movable contact piece 36A2 and the back surface of the movable contact piece 36A1 in the other contact terminal 36ai as shown in FIGS. 8B and 9B. Also, a contact gap of a predetermined value, for example, of 0.82 mm is formed between front surfaces of the movable contact piece 36A1 and 36A2 in the respective contact terminal 36ai.

As a result, even if a test signal is supplied to the respective contact terminal 36ai when the semiconductor element 22 is attached or detached, there is no risk of short-circuit accident. In addition, a sufficient amount of opening is obtainable in the respective contact terminal 36ai.

Then, in a state wherein the movable contact piece 36A2 of the contact terminal 36ai engaged with the engaging groove 34g is moved and held to be away from the movable contact piece 36A1, the semiconductor element 22 is placed on the placement region 30F of the positioning section 30 and each of the electrodes 22a of the semiconductor element 22 are positioned to a gap between the movable contact pieces 36A1 and 36A2 of the respective contact terminal 36ai as shown in FIGS. 13A to 13E and FIGS. 14A to 14E.

Figure 19A:
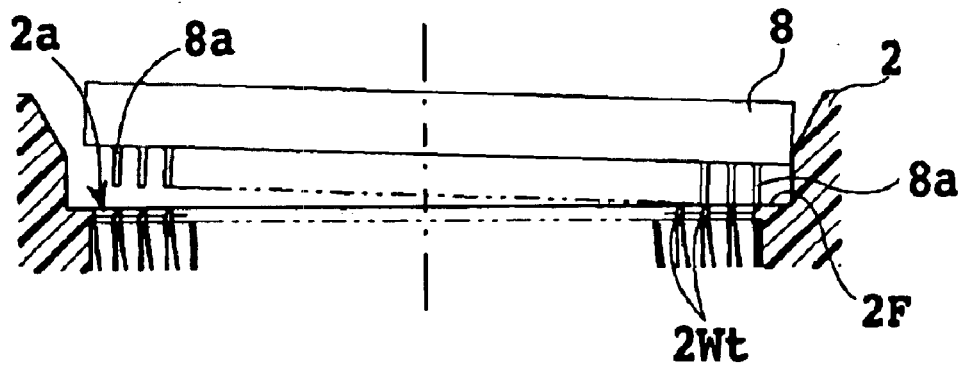
FIG. 19A is a partially sectional view made available for illustrating the operation of the embodiment shown in FIG. 15.
Figure 19B:
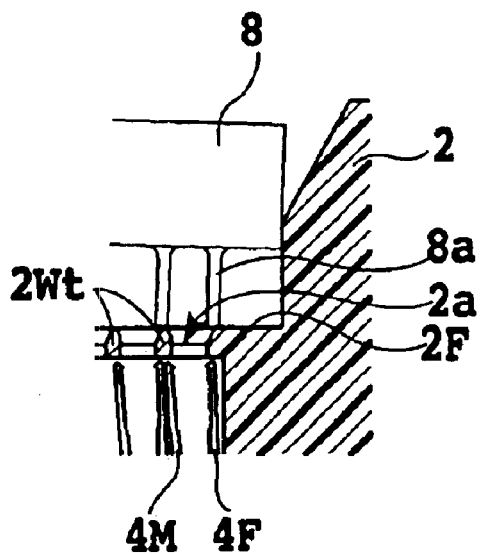
FIG. 19B is a partially sectional view of a portion of FIG. 19A in an enlarged manner.

The contact deviation member 2 may be structured so that an inner wall connecting the opposite ends of the respective partition wall 2Wa or 2Wt to each other directly intersect the end surface of a placement region 2F of the contact deviation member 2. In such a case, if the semiconductor element 8 drops from a predetermined position while maintaining an inclined posture as shown in FIGS. 19A and 19B at the time of the mounting, a front end of the electrode section 8a is not inserted into the contact accommodation portion 2a but is placed on the end surface of the placement region. As a result, the attachment of the semiconductor element may be interrupted. It is thought that such a failure is caused by the variation of an outer dimension of a package of the semiconductor element 8 and the relative distance between the electrode sections 8a.

For example, when a distance from the end surface of the package of the semiconductor element 8 to the outer circumference of the electrode section 8a (terminal) at an end thereof is smaller than a distance from the inner surface of the positioning section 30 to a boundary of the contact accommodation portion; i.e., the outer periphery of the contact accommodation portion, the attachment of the semiconductor package may be often interrupted. If a tolerance of the package profile of the semiconductor element 8, a terminal pitch, a terminal diameter and a positional accuracy of the terminal are ±0.2 mm, 1.27 mm, 0.35 mm±0.05 mm, and 0.5 mm, respectively, an area in which the terminal might exist on the profile of the package is 0.9 mm (=0.35+0.05+0.5).

On the other hand, a distance between positioning surfaces of the respective positioning members 30a to 30d is determined so that a gap of 0.1 mm is guaranteed around the profile of the package of the semiconductor element 8 even if the package has the profile of the maximum tolerance (+0.2 mm). Under the condition, if the outer dimension of the actual package of the semiconductor element 8 to be mounted is 0.2 mm smaller than the standard value, the package of the semiconductor element 8 is movable approximately 0.5 mm (=0.2+0.2+0.1) between the positioning surfaces of the positioning members 30a to 30d. Accordingly, since the area in which the terminal might exist is 1.4 mm (=0.9+0.5), the terminal of the semiconductor element 8 would move to be positioned on the placement region when a distance from the inner surface of the positioning member 30 to the boundary of the contact accommodating section exceeds 1.4 mm.

Figure 13A:
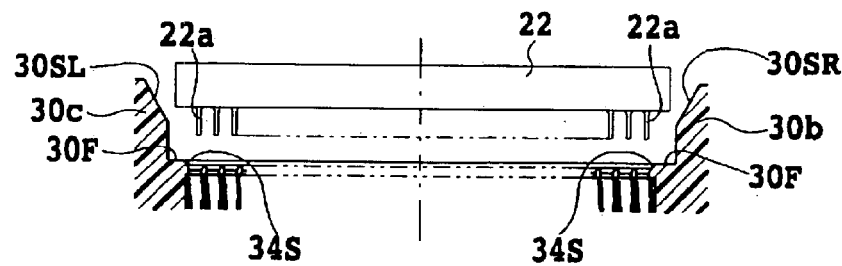
FIGS. 13A, 13B, 13C, 13D and 13E are partially sectional views, respectively, made available for illustrating the operation for mounting the semiconductor element.
Figure 13B:
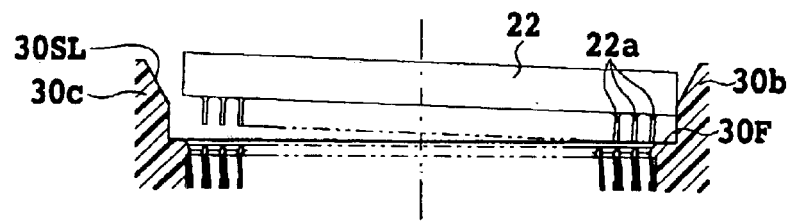
Figure 13C:
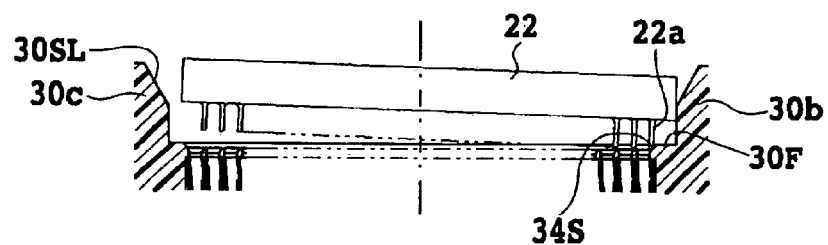
Figure 14A:
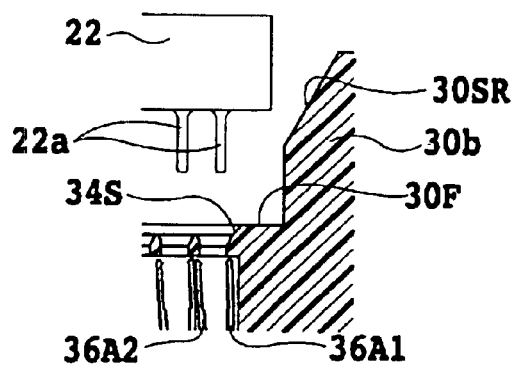
FIGS. 14A, 14B, 14C, 14D and 14E are partially sectional enlarged views, respectively, made available for illustrating the operation for mounting the semiconductor element.
Figure 14B:
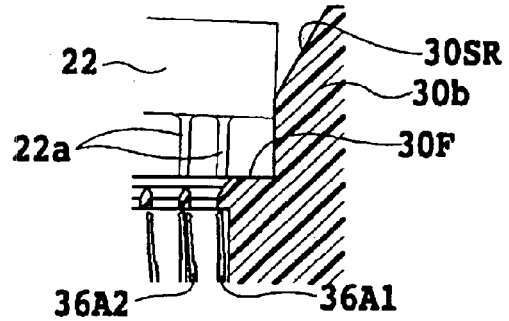
Figure 14C:
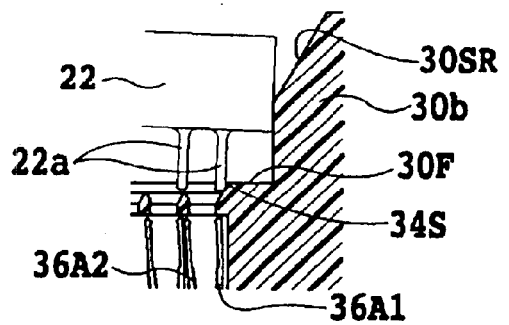

According to the embodiment of the present invention, as shown in FIGS. 13A and 14A, even if the semiconductor element 22 held at a predetermined position by a gripper of a transfer robot not illustrated is released and drops in the inclined posture onto the placement region to interfere with the positioning member 30b, a tip end of the electrode 22a is guided by the slope 30S and introduced into the opening 34a as shown in FIGS. 13B, 13C, 14B and 14C. Thus, a tip end of the electrode 22a is reliably inserted into the opening 34a.

Figure 13D:
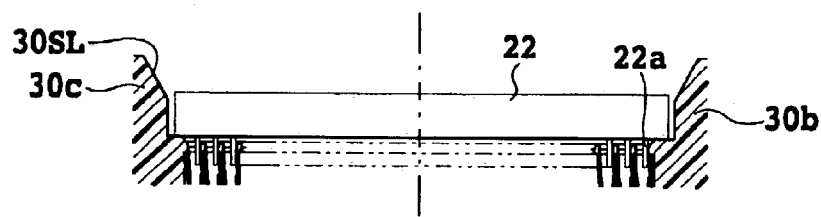
Figure 14D:
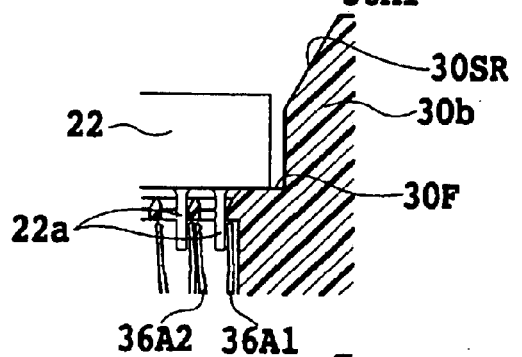

Therefore, as shown in FIGS. 13D and 14D, the electrodes 22a are positioned between the movable contact pieces 36A1 and 36A2 of the respective contact terminals 36ai.

When the cover member 32 is lifted as shown in FIG. 3 by a solid line, the contact deviation member 28 moves to the initial position by a biasing force of the coil spring 38 and a recovery force of the movable contact piece 36A2. Thus, the rib 34r is apart from the back surface of the movable contact piece 36A1 as shown in FIGS. 8C and 9C.

Figure 13E:
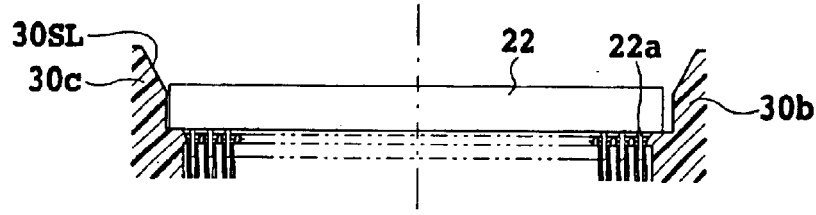
Figure 14E:
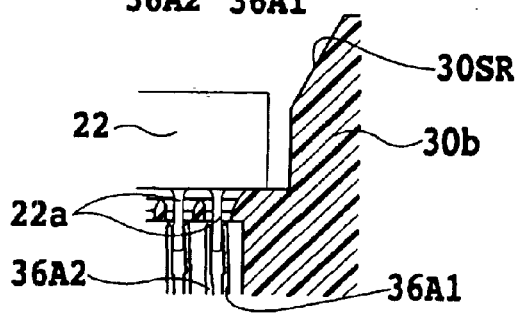
Figure 15:
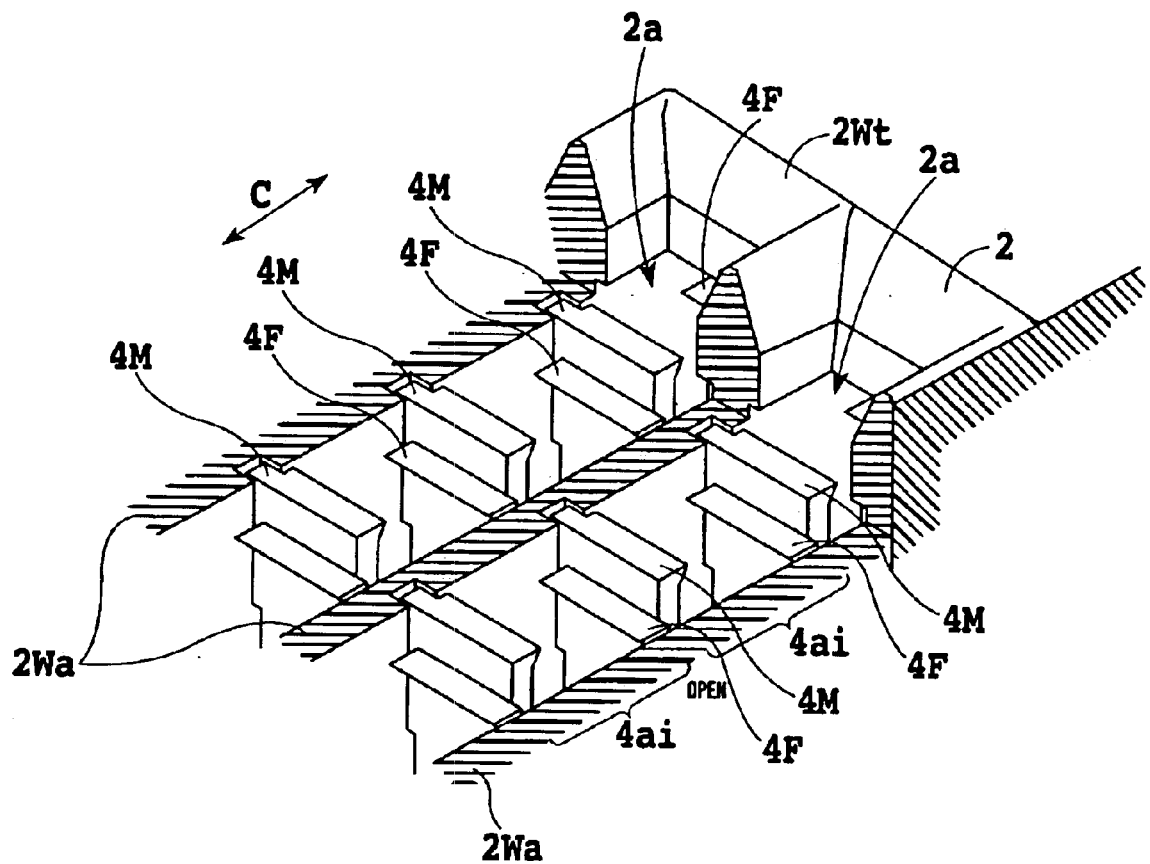
FIG. 15 is a perspective view partially illustrating an arrangement of contact terminals and contact deviation members provided in the prior art apparatus.
Figure 16:
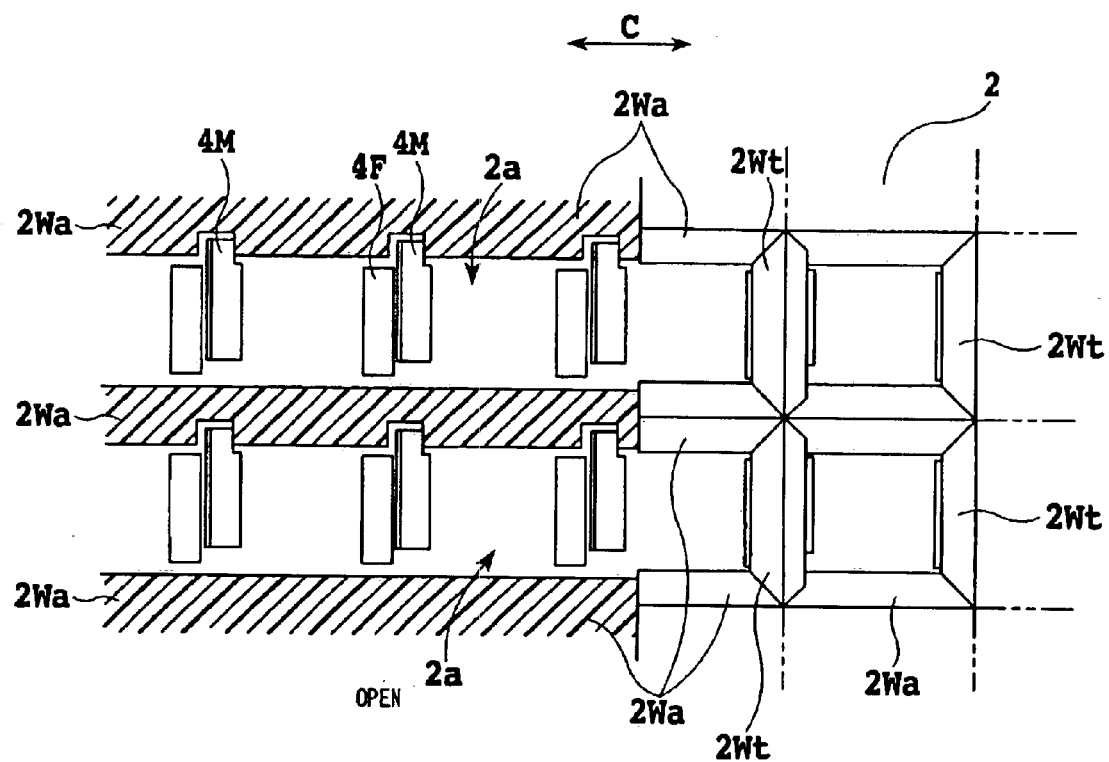
FIG. 16 is a plan view of contact terminals illustrating a state shown in FIG. 15.
Figures 17A, 17B, 17C:
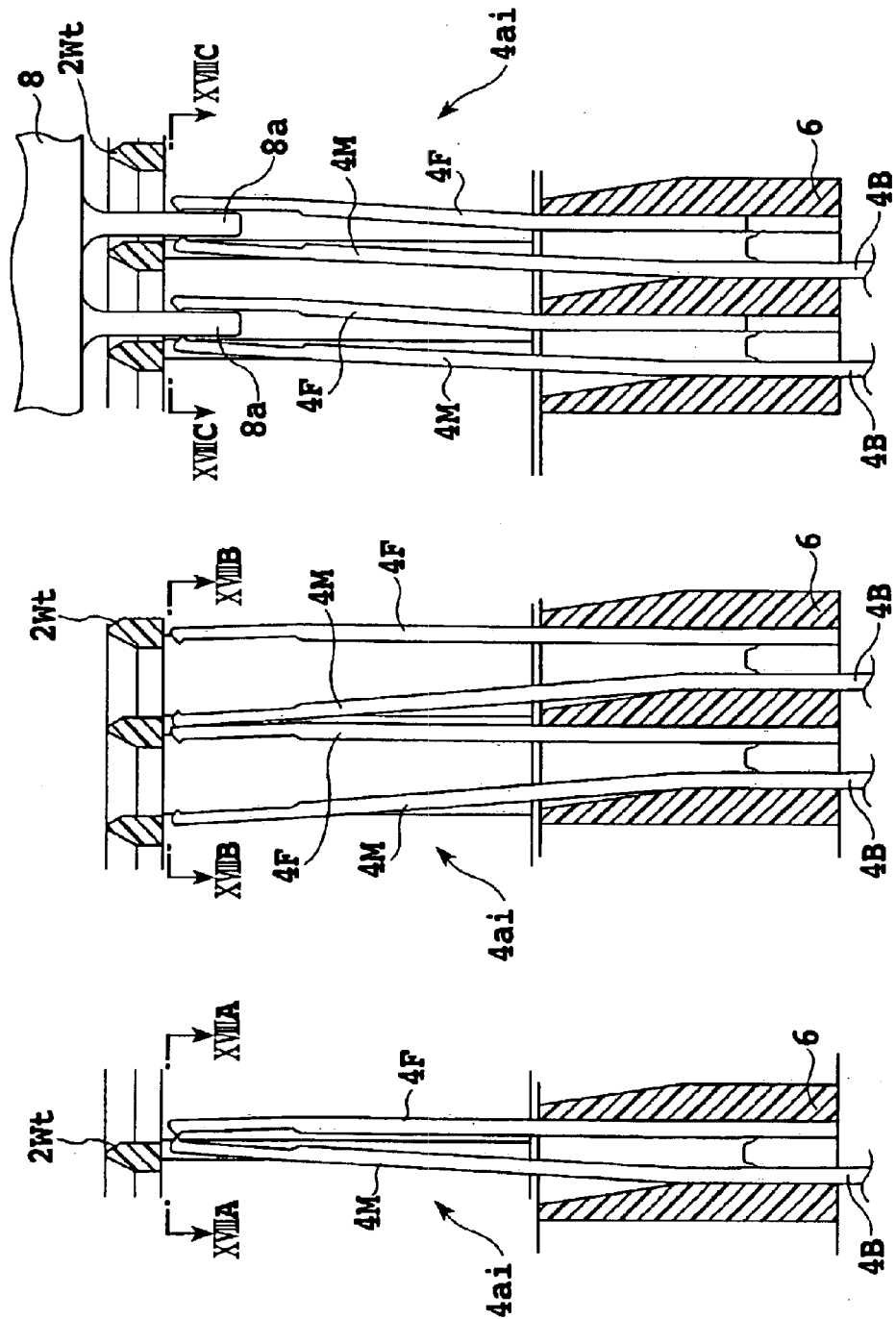
FIGS. 17A, 17B and 17C are partially sectional views, respectively, made available for illustrating the operation of the embodiment shown in FIG. 15.
Figure 18C:
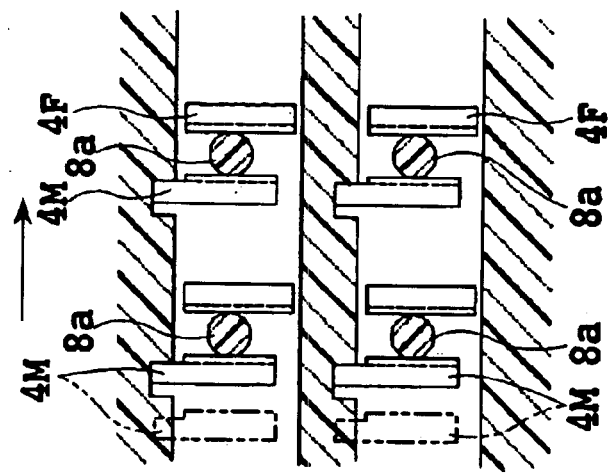
FIGS. 18A, 18B and 18C are sectional views, respectively, taken along a line XVIIIA—XVIIIA in FIG. 17A, along a line XVIIIB—XVIIIB in FIG. 17B and along a line XVIIIC—XVIIIC in FIG. 17C.
Figure 18B:
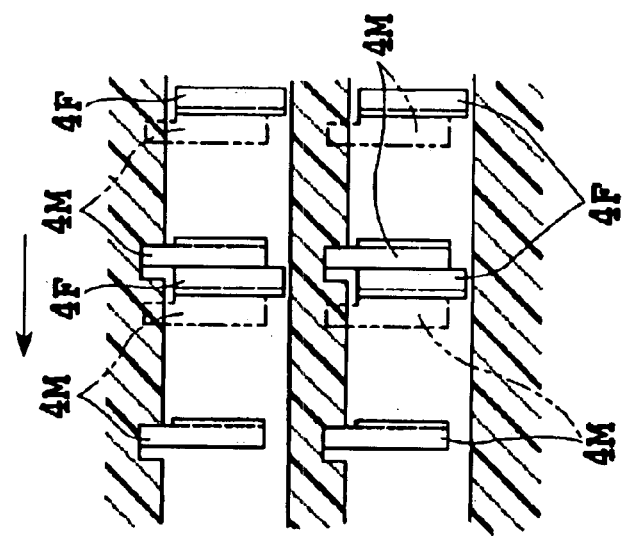
Figure 18A:
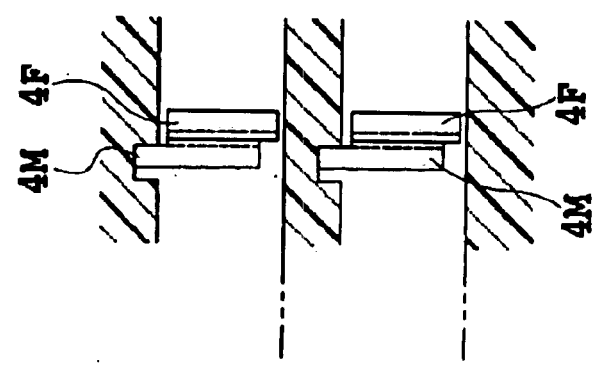

Accordingly, as shown in FIGS. 13E and 14E, the respective electrode 22a of the semiconductor element 22 is nipped between tip ends of the movable contact pieces 36A1 and 36A2, whereby the electrode 22a of the semiconductor element 22 is electrically connected to the respective contact terminal 36ai.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A socket for a semiconductor device having a plurality of electrodes, comprising:

a plurality of contact terminals, each having a first contact piece and a second contact piece, divided into rows and disposed in a socket body for accommodating said semiconductor device, wherein each contact terminal is electrically connectable to an electrode and at least one of the first contact pieces is movable.

a contact deviation member provided in said socket body in a movable manner, for causing said contact terminals to carry out an electrical connection/disconnection, and a position-restricting member formed in said contact deviation member as a projection that abuts at least one of the second contact pieces in the vicinity of said at least first contact piece to prevent an electrical connection between said contact terminals located in the same row.

2. A socket for a semiconductor device as claimed in claim 1, wherein partition walls divide the rows of said contact terminals, a plurality of the position-restricting members are disposed opposite select locations of the partition wall, and the first contact pieces are held to said partition walls at said select locations.

3. A socket for a semiconductor device as claimed in claim 2, wherein the portions are engaging grooves.

4. A socket for a semiconductor device as claimed in claim 1, wherein said position-restriction member is a projection adapter such that when the first contact piece in the adjacent contact terminal within the same row, said projection abuts to the back surface of the at least one second contact piece in the adjacent contact terminal and forms a gap between the at least one second contact piece in the adjacent contact terminal and at least one of the first contact pieces.

5. A socket for a semiconductor device as claimed in claim 1, wherein a slope is continuously formed along a boundary between an outer periphery of a contact accommodation portion of said socket for accommodating the contact pieces of the plurality of contact terminals and a placement region for placing said semiconductor device, for introducing said electrodes of said semiconductor device just before being placed into said contact accommodation portion.

6. A socket for a semiconductor device as claimed in claim 5, wherein the pair of movable contact pieces are apart by a predetermined distance from each other, and one of said movable contact pieces has a stepped portion engageable with said contact accommodation portion.

7. A socket for a semiconductor device as claimed in claim 6, wherein said stepped portion in the one of the pair of movable contact pieces is a tenon.

8. A socket for a semiconductor device having a plurality of electrodes, comprising:

a plurality of contact terminals, each having a first contact piece and a second contact piece, divided into rows and disposed in a socket body for accommodating said semiconductor device, wherein each contact terminal is electrically connectable to an electrode and the first contact piece and the second contact piece are movable;

a contact deviation member provided in said socket body in a movable manner, for causing said contact terminals to carry out an electrical connection/disconnection; and a position-restriction means formed in said contact deviation member, for restricting a position of at least one of the second contact pieces to prevent an electrical connection between adjacent contact terminals located in the same row;

wherein the first contact is movable together with said contact deviation member, partition walls divide the rows of said contact terminals, a plurality of said position-restricting means are disposed opposite to select locations of the partition walls, and the first contact pieces are held to said partition walls at said select locations.

* * * * *